(12) United States Patent
Navaratnam et al.

(10) Patent No.: US 10,706,900 B2
(45) Date of Patent: Jul. 7, 2020

(54) DATA AND CLOCK SYNCHRONIZATION AND VARIATION COMPENSATION APPARATUS AND METHOD

(71) Applicant: Intel Corporation, Santa Clara, CA (US)

(72) Inventors: Navindra Navaratnam, Penang (MY); Nasser A. Kurd, Portland, OR (US); Bee Min Teng, Penang (MY); Raymond Chong, Penang (MY); Nasirul I. Chowdhury, Portland, OR (US); Ali M. El-Husseini, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/178,346

(22) Filed: Nov. 1, 2018

(65) Prior Publication Data

US 2020/0143853 A1 May 7, 2020

(51) Int. Cl.
| | |
|---|---|
| *G11C 29/50* | (2006.01) |
| *G11C 7/22* | (2006.01) |
| *H03K 5/135* | (2006.01) |
| *G11C 7/10* | (2006.01) |
| *H01L 25/18* | (2006.01) |
| *H03K 5/00* | (2006.01) |
| *H01L 23/00* | (2006.01) |

(52) U.S. Cl.
CPC ............ *G11C 7/222* (2013.01); *G11C 7/1084* (2013.01); *G11C 7/1093* (2013.01); *H01L 25/18* (2013.01); *H03K 5/135* (2013.01); *H01L 24/16* (2013.01); *H01L 2224/16225* (2013.01); *H03K 2005/00019* (2013.01)

(58) Field of Classification Search
CPC ...................................................... G11C 29/50
USPC .................................................... 365/201
See application file for complete search history.

(56) References Cited

U.S. PATENT DOCUMENTS 6,182,253 B1 * 1/2001 Lawrence .............. G11C 29/50
 365/201

\* cited by examiner

*Primary Examiner* — Jason Lappas
(74) *Attorney, Agent, or Firm* — Green, Howard, & Mughal LLP

(57) ABSTRACT

An apparatus is provided for mitigating uncertainties in process, voltage, random, and systematic variations between first and second dies. The first die comprises a clock compensator to adjust one or more signal characteristics of an input clock, and to provide first and second clocks; a data transmitter to sample data with a version of the first clock and to transmit the sampled data to a data receiver of the second die, wherein the data receiver is to receive the sampled data and generate a received data; and a clock transmitter to transmit the second clock to a clock receiver of the second die, wherein the clock receiver is to generate a third clock, wherein a phase of the third clock is adjusted to generate a fourth clock, wherein a delayed version of the fourth clock is received by a sampler coupled to the data receiver to sample the received data.

14 Claims, 7 Drawing Sheets

DATA AND CLOCK SYNCHRONIZATION AND VARIATION COMPENSATION APPARATUS AND METHOD

BACKGROUND

To facilitate data transfer at high frequency (e.g., greater than 500 Megabits per second (Mbps)) between integrated circuits (ICs) of silicon dies in a package, while each die in the package may be on a different process technology node and/or different operation power supply voltage, data sampling and clock synchronization between the dies can be very challenging. Furthermore, on-die systematic and random variations within each die, and also between dies, further exacerbate timing margin constrains. Without proper mitigations, the on-die systematic and random variations within each die, and also between dies, introduces design complexity, degrades link data transfer rate and compromises the overall system performance, which leads to functional failures in dies.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
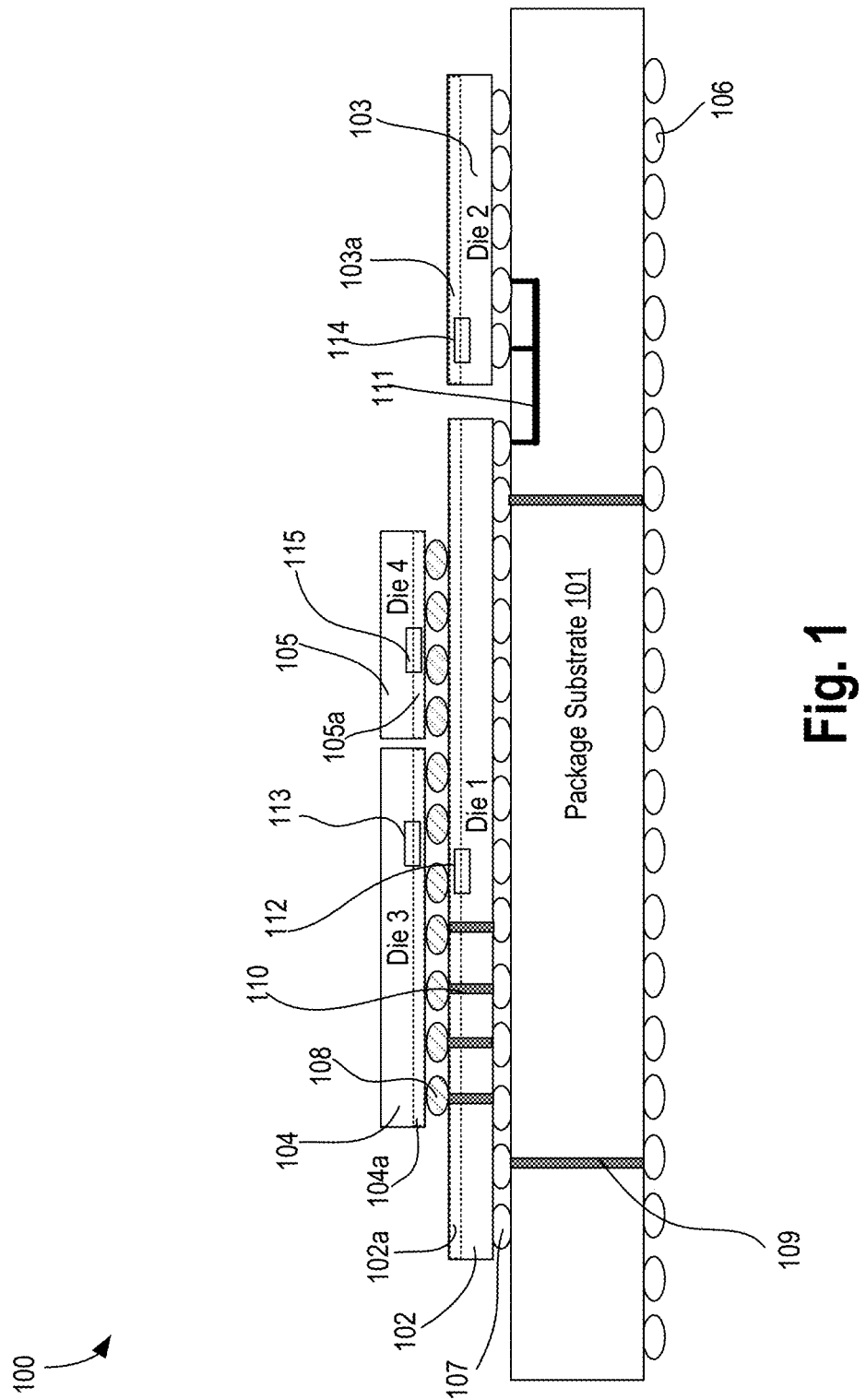
FIG. 1 illustrates a cross-section of a package with multiple dies and circuitry for clock and data synchronization between dies and for cancelling effects of variations such as process, voltage, random and systematic variations, according to some embodiments of the disclosure.

Ultra-high density packaging technology or die disaggregation technology is a new technology and a process evolvement, enabling a significant die size reduction (e.g., 4× reduction) which improves process yield, while achieving high bandwidth and data rate (e.g., 1 Terabits per second (Tbps) bandwidth with 2.4 Gigabits per second (Gbps) data rate). This new technology uses a high speed, yet simple and low power Single Data Rate (SDR) die-to-die IO (input-output) link for multi-die communication within a package, either side-by-side (e.g., using embedded multi die interconnect bridge—EMIB) or stacked (e.g., using interposer with through silicon via, TSV). The interposer may be an interposer die or an active die having logic devices and transistors.

Die-to-die IO (input-output) architecture is a technique for die disaggregation and multi-dimensional (e.g., 2.5D or 3D) multi-die integration. One example of die-to-die IO architecture utilizes die-to-die source synchronous architecture. Without more, die-to-die source synchronous architecture heavily relies on guard-bands during timing analysis to account for process, voltage, temperature, random and systematic variations between dies. As such, with both dies being on different process technology nodes and/or with different/separate supply voltages and/or temperature drifts, pre-silicon timing characterization can be very challenging, where too much guard-banding limits the convergence frequency and increases design convergence effort, while too little guard-banding in timing analysis may cause speed path escapees and functional failures.

Some embodiments describe a programmable low power die-to-die IO architecture that has the capability to operate robustly at high frequencies (e.g., 3 GHz at 0.85 V), for source synchronous architecture, by cancelling uncertainties in process, voltage, random and systematic variations between dice. In some embodiments, a programmable variation compensator is used with a training mechanism. The programmable low power die-to-die IO architecture comprises a source clock coarse compensator, a receiver clock fine compensator, a boot-up training scheme, and retraining mechanism. In some embodiments, the source clock coarse compensator comprises a programmable clock delay line which is placed at the clock point of divergence (POD) to enable fine and/or coarse running for aligning two clock tree spines in the different dies. The two clocks in the two clock tree spines may be aligned using software and/or hardware training. In some embodiments, the receiver clock fine compensator comprises a programmable pulse width generator at the receiver to adjust the sampling clock edge in fine steps. This process is also referred to as fine clock tuning. In some embodiments, the boot-up training scheme applies an algorithm to optimize timing margin by placing the sampling clock edge in the middle of the date eye thus cancelling out or mitigating (or reducing) process, voltage, and random and systematic variation across multiple dies. In some embodiments, the retraining mechanism comprises hardware and/or software to retraining cycles to track any VT (voltage and temperature) drifts in the sampling clock edge.

Some embodiments describe a continuous and dynamic process, voltage, and temperature (PVT) and variation compensation apparatus. The apparatus provides for dynamic tracking of any VT drifts while cancelling, mitigating or reducing out any static error (e.g., random and/or systematic variations). In some embodiments, the apparatus comprises: dynamically programmable source clock compensator, continuous loopback scheme, and decision making mechanism. In some embodiments, the dynamically programmable source clock compensator comprises a programmable clock delay line placed at the POD to enable fine and/or coarse tuning for aligning the clocks of the two clock spines in the different dies based on a feedback from a Finite State Machine (FSM). In some embodiments, the continuous loopback scheme comprises circuitry for feeding back the launching and sampling clocks in a matched manner, at the end of the clock distribution, to a phase detector in a first die for fine tuning and to provide dynamic threshold tracking.

Any voltage drift on the power supply or temperature shifts between the two dies can be corrected with the continuous loopback scheme. In some embodiments, the decision making mechanism filters an output of the phase detector and provides the filtered output to a finite state machine (FSM) which adjusts the programmable delay line until both the sampling and generating clock edges are aligned.

There are many technical effects of the various embodiments. For example, the programmable low power die-to-die IO architecture and/or the continuous and dynamic PVT and variation compensation apparatus allows for smaller clock skew penalty and ease design convergence efforts thus providing significant frequency boost over prior schemes. The techniques of some embodiments also eliminates (or reduces) the need for complex clock data recovery and the use of Delay Locked Loop (DLL) which are power hungry and consumes significant design effort. The embodiments also reduce the latency in common clock architecture without the use of a delay locked loop. The architectures of various embodiments are modular, scalable due to digital technique and consumes lower power (e.g., 5× lower power) which fits into ultra-high density packaging or die disaggregation applications. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a cross-section of a package 100 with multiple dies and circuitry for clock and data synchronization between dies and for cancelling effects of variations such as process, voltage, random and systematic variations, according to some embodiments of the disclosure. Package 100 comprises package substrate 101, first die 102 (Die 1), second die 103 (Die 2), third die 104 (Die 3), and fourth die 105 (Die 4). These dies can be of the same process technology node or different process technology nodes.

For example, Die 1 and Die 2 may be on a 7 nm (nanometer) CMOS process technology node, Die 3 may be on a 10 nm CMOS process technology node, Die 4 may be a GaAs process technology node. For ease of reducing signal latency, the active regions of the dies may face one another when the dies are stacked vertically along the z-axis. Here, active region of die 102 is illustrated as region 102a, active region of die 103 is illustrated as region 103a, active region of die 104 is illustrated as region 104a, and active region of die 105 is illustrated as region 105a.

In some embodiments, the dies are communicatively coupled to other another via through silicon vias (TSVs) that allow for communication along the z-axis. For example, TSVs (or any suitable interconnect or via technologies) 109 and 110 can be used to communicate between PCB and the dies along the z-direction. In some embodiments, a silicon interposer in the redistribution layer (RDL) is used for communication between dies along the x-axis. For example, silicon interposer 111 in RDL is used to communicate between Die 1 and Die 2. The package substrate 101 is coupled to a printed circuit board (PCB) via bumps 106. One example, of the bumps 106 are solder balls. Similar solder balls 107 can be used to couple the dies with package substrate 101. In some embodiments, micro bumps are used to couple dies within a stack. For example, micro bumps 108 are used to couple Die 3 and Die 4 with Die 1.

In various embodiments, programmable low power die-to-die IO architectures (e.g., 112, 113, 114, and/or 115) are provided that have the capabilities to operate robustly at high frequencies (e.g., 3 GHz and higher at 0.85 V), for source synchronous architecture, by cancelling uncertainties in process, voltage, random and systematic variations between dies. In some embodiments, low power die-to-die IO architectures (e.g., 112, 113, 114, and/or 115) are provided that have the capabilities to operate robustly at high frequencies (e.g., 3 GHz and higher at 0.85 V), for common clock architecture, by dynamically and continuously cancelling uncertainties in process, voltage, random and systematic variations between dies.

Figure 2:
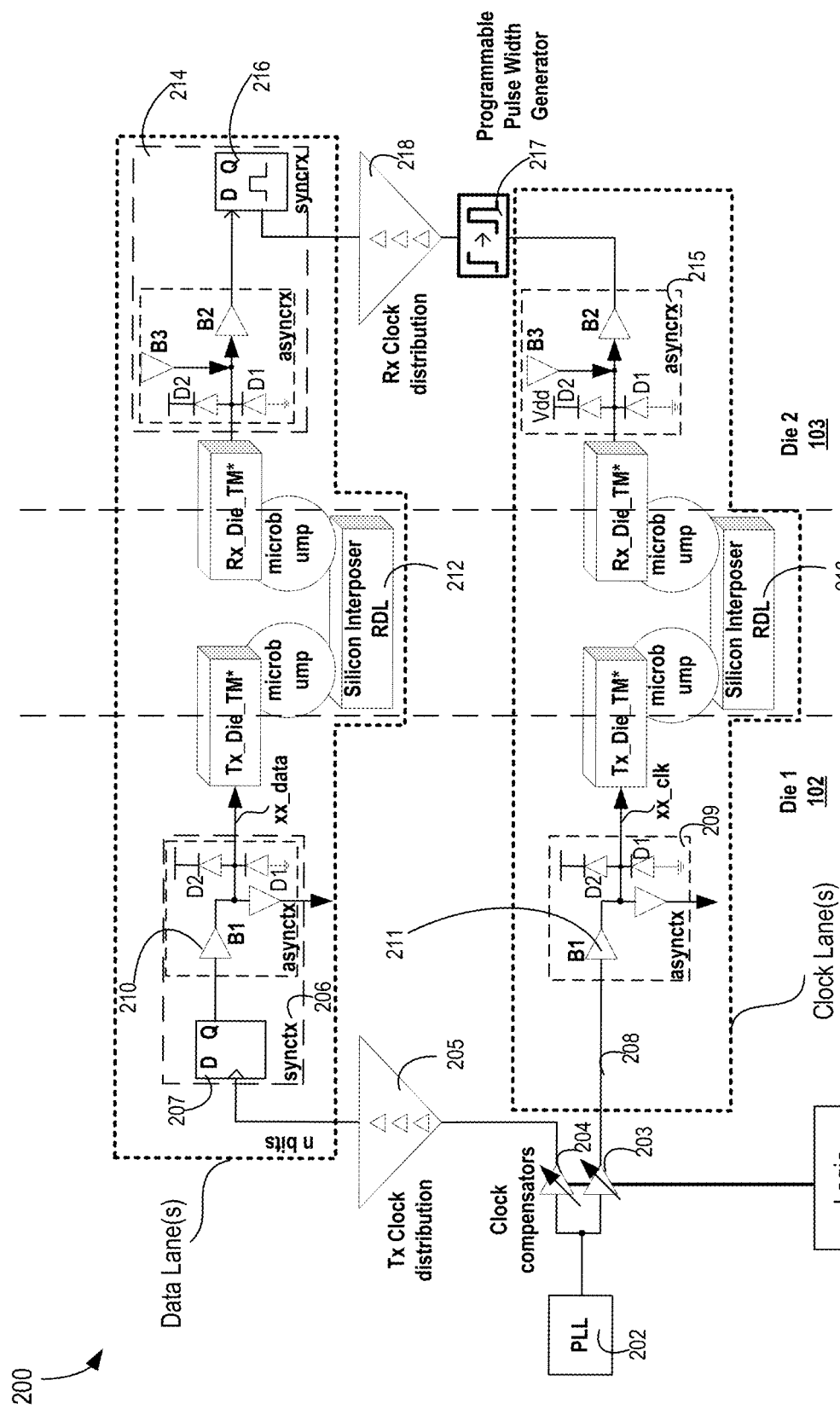
FIG. 2 illustrates a source synchronous architecture for programmable variations compensation, in accordance with some embodiments.

FIG. 2 illustrates a source synchronous architecture 200 for programmable variations compensation, in accordance with some embodiments. Architecture 200 comprises apparatus which is distributed between Die 1 (102) and Die 2 (103). Die 1 comprises logic 201 (e.g., finite state machine (FSM)), a clock source 202 (e.g., oscillator, phase locked loop (PLL), digital PLL, analog PLL, mixed-signal PLL, LC-PLL, etc.), transmitter portion of data lane(s), transmitter portion of clock lane(s), clock compensators 203 and 204, transmitter (Tx) clock distribution network 205. Die 2 comprises receiver portion of data lane(s), receiver portion of clock lane(s), programmable pulse width generator 217, and receiver (Rx) clock distribution network 218. For sake of not obscuring the embodiments, simplified versions of transmitters and receivers are shown.

The Data Lane(s) may include n-bits of data lanes, each having its own transmission path from die 1 to die 2. In some embodiments, the transmitter portion of the data lane comprises a synchronous transmitter circuitry 206 including a data sampler 207 coupled to an asynchronous transmitter circuitry including pre-driver B1 210, electrostatic discharge (ESD) diodes D1 and D2. The data to be transmitted is xx_data which propagates through the transmitter die to the receiver die via silicon interposer RDL 212 (same as 111). In embodiments where dies are stacked, the silicon interposer RDL 212 may be replaced with TSVs such as TSV 110 or with micro bumps (µBumps) such as µBumps 108. The receiver portion of data lane comprises a synchronous receiver circuitry 214 including a data sampler 216 coupled to an asynchronous receiver circuitry including amplifier B2 220 and ESD diodes D1 and D2. The transmitter portion of the clock lane comprises an identical transmitter as the data transmitter, but without the sampler, for example.

In this example, transmitter portion of the clock lane comprises asynchronous transmitter 209 having pre-driver B1 211 coupled to ESD diodes D1 and D2. The clock to be transmitted is xx_clk which propagates through the transmitter die to the receiver die via silicon interposer RDL 213 (same as 111). In embodiments where dies are stacked, the silicon interposer RDL 213 may be replaced with TSVs such as TSV 110. The receiver portion of clock lane comprises an asynchronous receiver circuitry 215 including amplifier B2 221 and ESD diodes D1 and D2. A person skilled in the art would appreciate that implementations of transmitters and receivers may include many other circuits such as impedance terminations, clock-to-output (TCO) delay buffers, minimum delay buffers, amplifiers, bias generators, etc., but are not shown to avoid obscuring the various embodiments.

In some embodiments, PLL 202 of Die 1 generates a high frequency clock, which is sent to two identical clock compensators 203 and 204. These clock compensators are placed at the point of divergence (POD) of the data and clock lanes. In some embodiments, compensators 203 and 204 have the ability to tune the launching and sampling clocks independently through coarse and/or fine settings. These setting may be provided by logic 201. In some embodiments, during boot-up prior to any training, a default safe fuse value is loaded into the compensators 203 and 204 to set or initialize the delay configuration and/or other performance parameters (e.g., slew rate, pulse width, etc.). The launch clock is then distributed via recombinant clock tree 205 to ensure clock skew between data lanes are kept at minimal. In each data lane, a synchronizer 207 is used to re-time transmit data on a micro-bump via driver 210 and RDL 212.

On the other hand, sampling clock 208 is sent through an asynchronous transmitter (ASYNCTX) block 209 which is replica version of Synchronous Transmitter (SYNCTX) 206. The synchronized data lanes and clock are sent source synchronously to the Die 2 103 through pre-driver and driver in B1 210 and 211, respectively. To keep the architecture simple and low power, the pre-driver and driver are constructed with two stages of inverters sending a full swing CMOS signaling through the silicon interposer 212, 213 to Die 2 receivers accordingly—Synchronous Receiver (SYNCRX) 214 and Asynchronous Receiver (ASYNCRX) 215.

Die 2's SYNCRX 214 and ASYNCRX 215 circuitries are exactly the same, but SYNCRX has a latch 216 as a sampler while ASYNCRX goes through a programmable pulse width generator 217 and a clock tree distribution 218 that matches to Die 1's clock tree distribution 205 design in terms of buffering stages and RC (resistance-capacitance propagation delay). In some embodiments, the programmable pulse width generator 217 has the capability to shape the clock's pulse width and finely tune the sampling clock edges through a boot-up training mechanism.

A boot-up, training mechanism uses software algorithms and/or hardware logic to tune the performance parameters of clock compensators 203 and 204, and programmable pulse width generator 217 to reliably cancel out process, voltage, systematic and random variations between two dies. During boot-up, each data lane sends a continuous test pattern (e.g., pattern 1010 . . . ) from Die 1 to Die 2, where an optimization flow sweeps through all possible settings of programmable pulse width generator 217 and picks the settings that provide the best overall performance as measured by the eye width at the sampler 216. The software algorithm and/or hardware logic then places the sampling edge in the middle of the widest passing window of the data eye. Due to noise concerns, a majority vote counter may be used to ensure adequate noise suppression. In some cases, it is possible for the algorithm or hardware logic to not find any passing window due to huge mismatch in the clock distributions, 205 and 218 between the dies due to process nodes or voltage drifts. In one such case, the clock compensators 203, 204 can be coarsely trained by delaying the clock lanes or the data lanes independently, such that the clock edge from the pulse width generator 217 falls within the data pulses.

Figure 3:
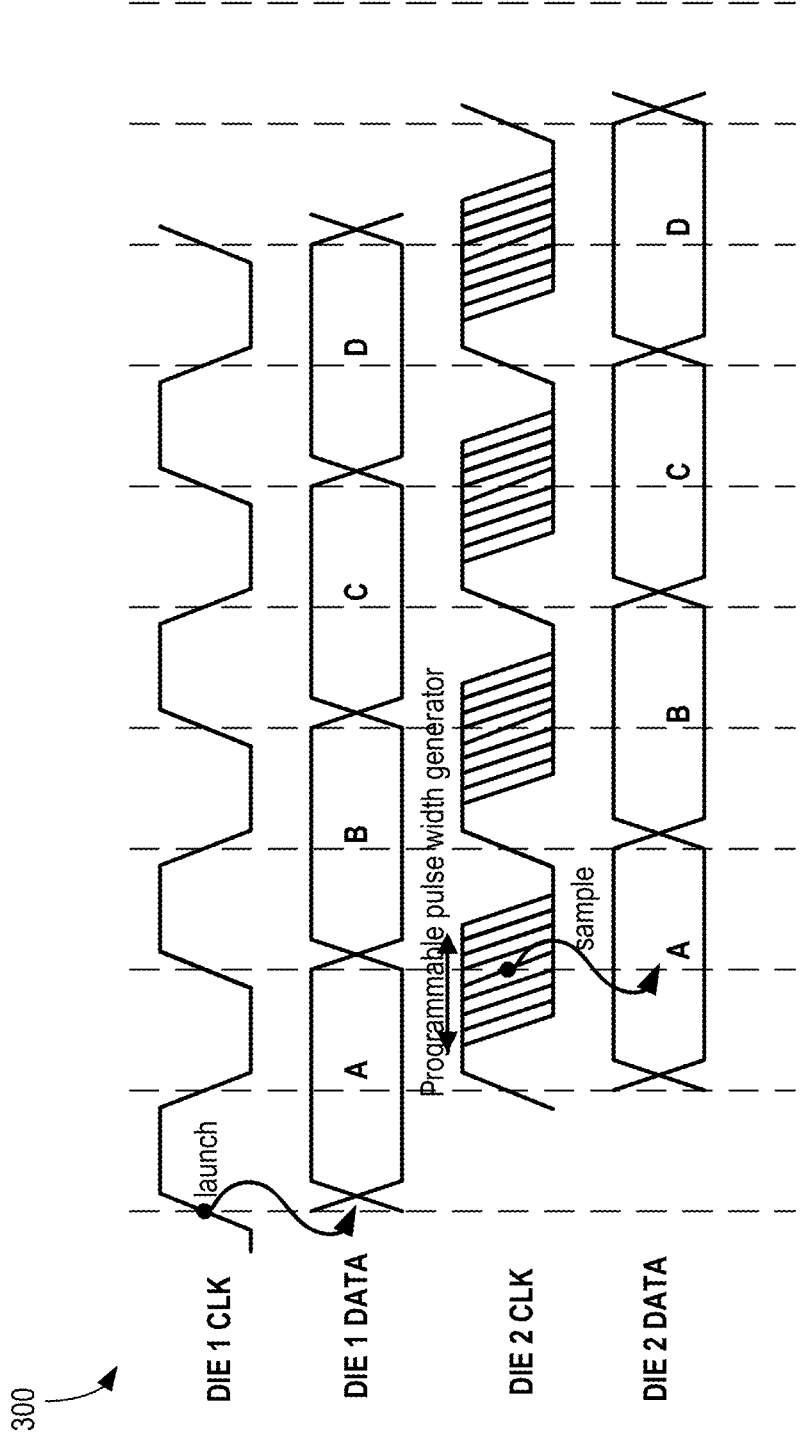
FIG. 3 illustrates a timing diagram for the source synchronous programmable variations compensation scheme, in accordance with some embodiments.

FIG. 3 illustrates a timing diagram 300 for the source synchronous programmable variations compensation scheme, in accordance with some embodiments.

Figure 4:
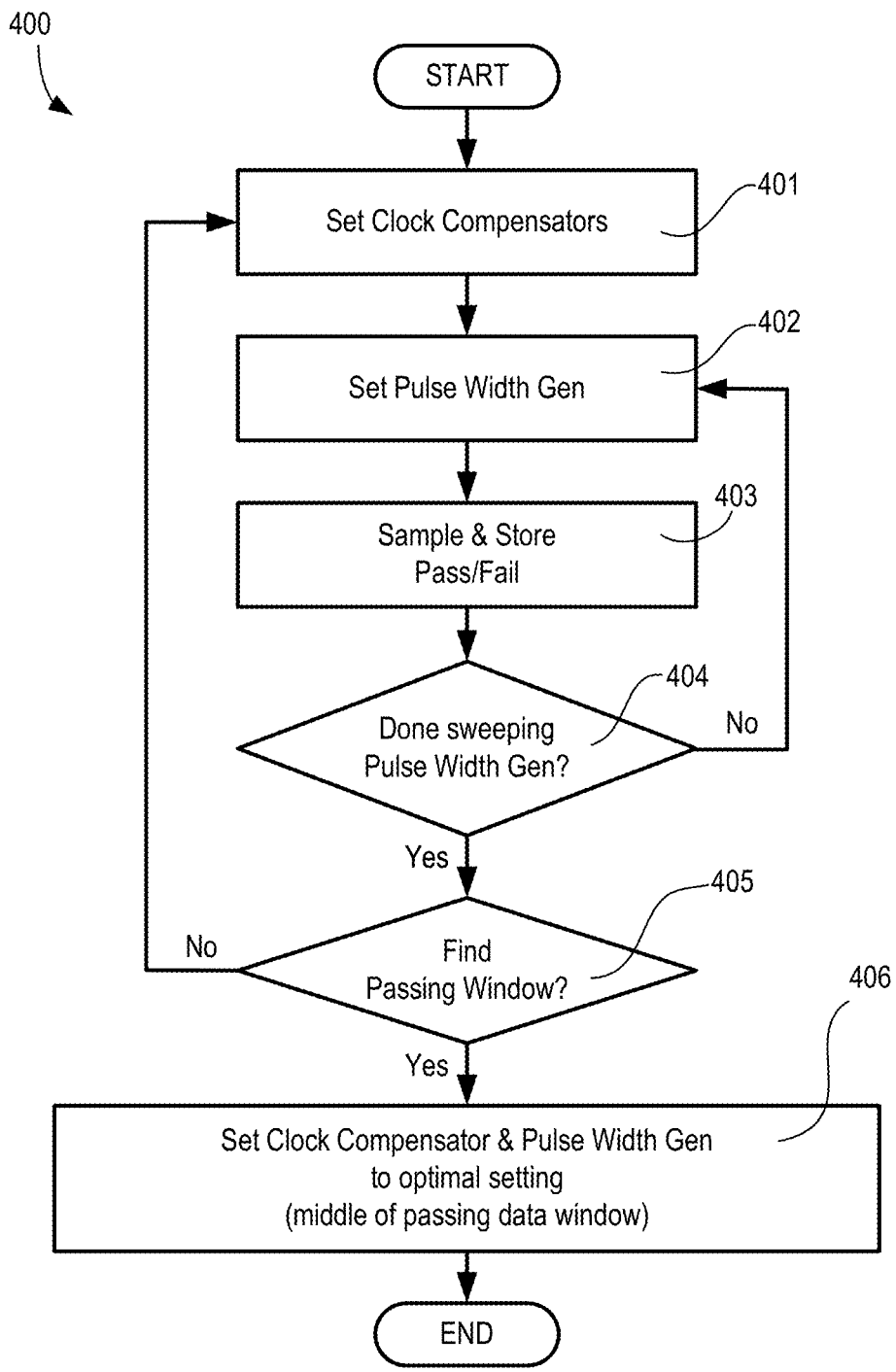
FIG. 4 illustrates a flowchart of training clock alignment relative to data using the source synchronous programmable variations compensation scheme, in accordance with some embodiments.

FIG. 4 illustrates a flowchart 400 of training clock alignment relative to data using the source synchronous programmable variations compensation scheme, in accordance with some embodiments. The various operation block shown in flowchart can be performed out of order, in parallel, or in the order shown. For example, blocks 401 and 402 can be performed in parallel or simultaneously.

At block 401, the delay and/or other performance parameters of clock compensators 203 and 204 are set or initialized. For example, upon boot-up, a fuse value(s) is read are provided to clock compensators 203 and 204 set their drive strengths, propagation delay, and/or slew rate, etc. At block 402, the pulse width generator 217 is also initialized or set. For example, the delay of a falling edge of a clock (wherein the delay is an example of a performance parameter of the pulse width generator 217) is set or initialized. In some embodiments, fuse values at boot-up or a training phase are read and used to initialize the performance parameters of clock compensators 203 and 204 and pulse width generator 217. In some embodiments, the operating system or any software can also be used to initialize the performance parameters of clock compensators 203 and 204 and pulse width generator 217.

At block 403, results of sampling received data using the received clock is analyzed to determine whether correct data was captured. Thereafter, at block 404, setting for the pulse width generator 217 is swept from smallest delay to larger delay in a fine step (e.g., 1 picosecond (ps) step). For instance, the falling edge of the received clock is pushed out by 1 ps step and results of sampling received data using the received clock is analyzed to determine whether correct data was captured. Once the process of sweeping or pushing out (or alternatively pulling in) the falling clock edge is complete, the process proceeds to block 405. At block 405, a determination is made after the passing time window in which data was correctly sampled for a given delayed falling edge clock. A boot-up, training mechanism uses software algorithms and/or hardware logic to tune the performance parameters of clock compensators 203 and 204, and programmable pulse width generator 217 to reliably cancel out process, voltage, systematic and random variations between two dies. During boot-up, each data lane sends a continuous test pattern (e.g., pattern 1010 . . . ) from Die 1 to Die 2, where an optimization flow sweeps through all possible settings of programmable pulse width generator 217 and picks the settings that provide the best overall performance as measured by the eye width at the sampler 216. This setting for the best overall performance indicates the passing window.

Once the passing window is determined (e.g., once it is figured out where the falling edge of the received clock should be placed for correctly sampling the data), the process proceeds to block 406. At block 406, the performance parameters of clock compensators 203 and 204, and programmable pulse width generator 217 are set to achieve the best overall performance. For example, the performance parameters of clock compensators 203 and 204, and programmable pulse width generator 217 are set to cause the received falling edge of the clock to be centered in a data eye to sample data correctly with most timing margin.

Figure 5:
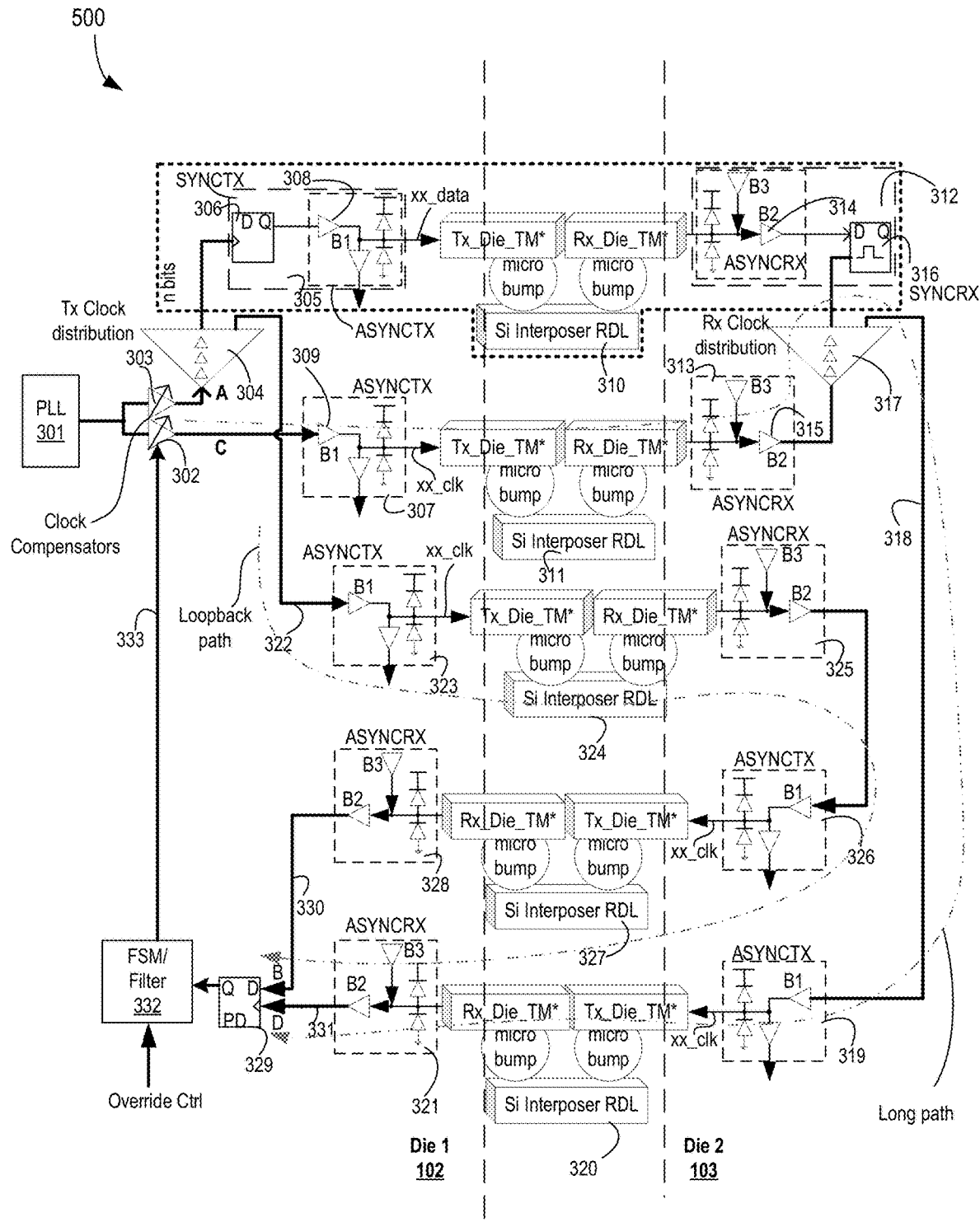
FIG. 5 illustrates a common clock architecture for continuous and dynamic process, voltage, and temperature (PVT) variations compensation, in accordance with some embodiments.

FIG. 5 illustrates a common clock architecture 500 for continuous and dynamic process, voltage, and temperature (PVT) variations compensation, in accordance with some embodiments. Architecture 500 is almost similar to the architecture 200 but has added 3 additional micro bumps to provide continuous feedback without the need for dead cycles for retraining. Here, the programmable pulse width generator is also removed. However, some embodiments can have the programmable pulse width generator that operates same as programmable pulse width generator 217.

Architecture 500 comprises an apparatus which is distributed between Die 1 (102) and Die 2 (103). Die 1 comprises a clock source 301 (e.g., oscillator, phase locked loop (PLL), digital PLL, analog PLL, mixed-signal PLL, LC-PLL, etc.), transmitter portion of data lane(s), transmitter portion of clock lane(s), clock compensators 302 and 303, transmitter (Tx) clock distribution network 304, phase detector 329, FSM 332, etc. Die 2 comprises receiver portion of data lane(s), receiver portion of clock lane(s), receiver (Rx) clock distribution network 317. For sake of not obscuring the embodiments, simplified versions of transmitters and receivers are shown.

The Data Lane(s) may include n-bits of data lanes, each having its own transmission path from die 1 to die 2. In some embodiments, the transmitter portion of the data lane comprises a synchronous transmitter circuitry 305 including a data sampler 306 coupled to an asynchronous transmitter circuitry including pre-driver B1 308, electrostatic discharge (ESD) diodes D1 and D2. The data to be transmitted is xx_data which propagates through the transmitter die to the receiver die via silicon interposer RDL 310 (same as 111). In embodiments where dies are stacked, the silicon interposer RDL 310 may be replaced with TSVs such as TSV 110 or with micro bumps (μBumps) such as μBumps 108. The receiver portion of data lane comprises a synchronous receiver circuitry 312 including a data sampler 316 coupled to an asynchronous receiver circuitry including amplifier B2 314 and ESD diodes D1 and D2. The transmitter portion of the clock lane comprises an identical transmitter as the data transmitter, but without the sampler, for example.

In this example, transmitter portion of the clock lane comprises asynchronous transmitter 307 having pre-driver B1 309 coupled to ESD diodes D1 and D2. The clock to be transmitted is xx_clk which propagates through the transmitter die to the receiver die via silicon interposer RDL 311 (same as 111). In embodiments where dies are stacked, the silicon interposer RDL 311 may be replaced with TSVs such as TSV 110 or with micro bumps (μBumps) such as μBumps 108. The receiver portion of clock lane comprises an asynchronous receiver circuitry 313 including amplifier B2 315 and ESD diodes D1 and D2. A person skilled in the art would appreciate that implementations of transmitters and receivers may include many other circuits such as impedance terminations, clock-to-output (TCO) delay buffers, minimum delay buffers, amplifiers, bias generators, etc.

In some embodiments, PLL 301 of Die 1 generates a high frequency clock, which is sent to two identical clock compensators 302 and 303. These clock compensators are placed at the POD of the data and clock lanes. In some embodiments where it is desirable to align the outputs of the transmitter (Tx) clock distribution 304 and the receiver (Rx) clock distribution 317 in time, an earlier clock is sent to Die2 to mitigate the additional delay through ASYNCTX 307, RDL311 and ASYNCRX 313 such that total delay from POD to Tx Clock distribution 304 and to Rx Clock Distribution 317 are nominally matched. In some embodiments, compensators 302 and 303 have the ability to tune the launching and sampling clocks independently through coarse and/or fine settings. These setting may be provided by logic FSM 332. In some embodiments, during boot-up prior to any training, a default safe fuse value is loaded into the compensators 302 and 303 to set or initialize the delay configuration and/or other performance parameters (e.g., slew rate, pulse width, etc.). The launch clock is then distributed via recombinant clock tree 304 to ensure clock skew between data lanes are kept at minimal. In each data lane, a synchronizer 306 is used to re-time transmit data on a micro-bump via driver 308 and RDL 310.

On the other hand, sampling clock is sent through an asynchronous transmitter (ASYNCTX) block 307 which is replica version of ASYNCTX block of the data lane. The synchronized data lanes and clock are sent source synchronously to the Die 2 103 through pre-driver and driver in B1 308 and 309, respectively. To keep the architecture simple and low power, the pre-driver and driver are constructed with two stages of inverters sending a full swing CMOS signaling through the silicon interposer 310, 311 to Die 2 receivers accordingly—Synchronous Receiver (SYNCRX) 312 and Asynchronous Receiver (ASYNCRX) 313.

Die 2's SYNCRX 312 and ASYNCRX 313 circuitries are exactly the same, but SYNCRX has a latch 316 as a sampler while ASYNCRX goes through a clock tree distribution 317 that matches to Die 1's clock tree distribution 304 design in terms of buffering stages and RC (resistance-capacitance propagation delay).

Here, a clock loopback path is provided from transmitter die 1 102 to receiver die 2 103 and back to transmitter die 1, indicated by the dotted line. The phase detector 329 compares the clocks through the loopback path and the clock 318 from the clock distribution 317 at the receiver die 2 to determine the uncertainties in the clocks. The loopback path sends the transmit clock 322 which is an output of the clock distribution network 304. The transmit clock 322 is the same clock which is used by samplers 306 in the data lanes. The transmit clock is received by transmitter ASYNCTX 323 and send to receiver ASYNCRX 325 in die 2 via silicon (Si) interposer RDL 324. At the receiver, the clock is received and resent back to die 1 102 by transmitter 326. For example, transmitter ASYNCTX 326 in die 2 103 sends the received clock back to die 1 102 via Si Interposer RDL 327. The receiver ASYNCRX 328 at die 1 102 receives the clock and generates the loopback clock 330, which is provided as input B to phase detector 329. The other clock received by the phase detector 329 is the long path receive clock which includes the path 318, ASYNCTX 319, Si Interposer RDL 320, and ASYNCRX 321 as shown.

To capture the delay variations between data and clock I/O paths dynamically, the phase difference between the clock distributions 304 and 317 from die 1 and die 2 are sampled continuously with a phase detector 329. In doing so, an identical loopback path for the launching clock (point A to point B) is created to match the loopback path delay for the sampling clock (point C to point D). Meanwhile, a single clock bit 322 and 318 is tapped out from each clock distribution network 304 and 317 as part of the loopback paths. As a result, with both loopback paths identical, the phase difference detected is caused by the mismatches in the clock distribution networks 304 and 317. In some embodiments where it is desirable to align the outputs of Tx clock distribution 304 and Rx clock distribution 317 in time (e.g., clock bits 322 and 318), the loopback path is shortened to bypass the Si Interposer RDL 324, ASYNCRX 325, ASYNCTX 326, Si Interposer RDL 327 by directly connecting TX_DIE_TM* out of ASYNCTX 323 to RX_Die_TM* of ASYNCRX 328.

Once the phase detector 329 detects a phase difference, a feedback signal is sent to the FSM 332. If the launching clock lags behind the sampling clock, the sampling clock is pushed out and vice versa. In some embodiments, the FSM 331 has built-in digital filtering to ignore clock skew or jitter, and aligns both clock edges and dynamically adjusts the source clock compensators 302 delay through configuration settings 333. To prevent any functional failures during calibration, the FSM 332 may allow a linear search with limited range when enabled while using deeper digital filtering to average out any noise sources.

Figure 6:
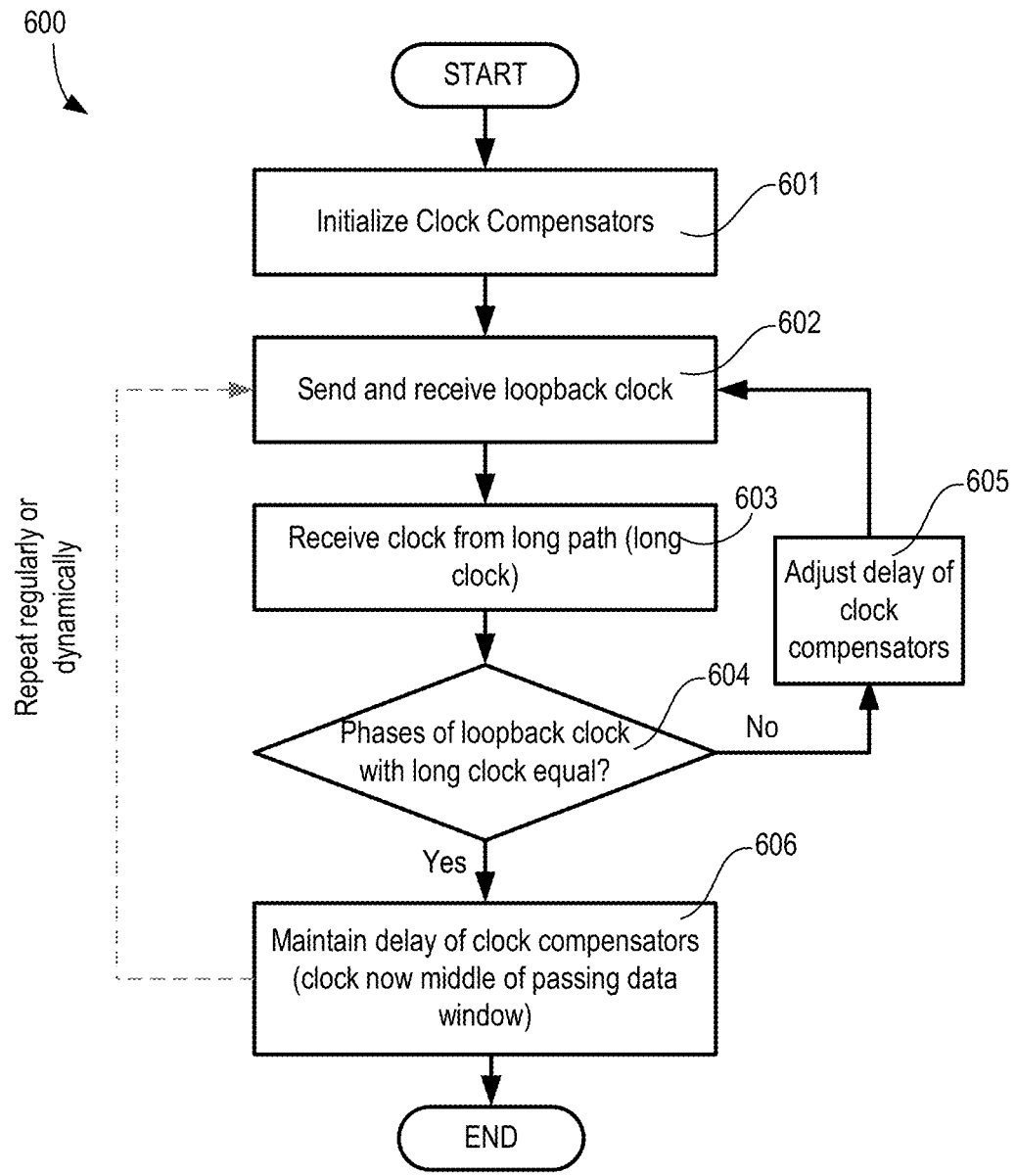
FIG. 6 illustrates a flowchart of dynamic and continuous clock alignment relative to data using the apparatus of FIG. 5, in accordance with some embodiments.

FIG. 6 illustrates a flowchart 600 of dynamic and continuous clock alignment relative to data using the apparatus of FIG. 5, in accordance with some embodiments. The various operation block shown in flowchart can be performed out of order, in parallel, or in the order shown. For example, blocks 602 and 603 can be performed in parallel or simultaneously.

At block 601, the delay and/or other performance parameters of clock compensators 302 and 303 are set or initialized. For example, upon boot-up, a fuse value(s) is read are provided to clock compensators 302 and 303 set their drive strengths, propagation delay, and/or slew rate, etc. In some embodiments, FSM 332 provides initial setting or values for the performance parameters of clock compensators 203 and 204.

At block 602, loopback clock is sent through the loopback path from die 1 102 to die 2 103, and back to die 1 102. The loopback clock is received at point B at the input of phase detector 329. At block 603, receive clock 318 from the long path, which includes path from point C through clock distribution 317, through Si interposer 320, is received at point D at the input phase detector 329.

At block 604, phase detector 329 compares the clocks at points B and D and FSM 332 determines from the output of phase detector 329 whether the loopback clock and the long path clock have aligned phases. If the phases are not aligned, then FSM 332 adjusts one or more performance parameters of clock compensators 302 and 303. For example, propagation delay of the clock compensators either 302 or 303 is increased or decreased at block 605. The process then proceeds back to block 602. If the phases are aligned, then FSM 332 maintains the one or more performance parameters of clock compensators 302 and 303. For example, propagation delay of the clock compensators 302 and 303 is maintained at block 606. This process may be applied continuously for dynamically changing the one or more performance parameters of clock compensators 302 and 303 to align the loopback clock and the long path clock, as indicated by the dotted line.

Architectures 200 and 500 enable die-to-die IO timing trainings and optimization between data and clock across two dies with minimal overhead in terms power and performance, that make the system robust and high speed (e.g., data rate as high as 3 Gbps). The second architecture 500 offers a continuous tracking scheme to nullify the effects of temperature and voltage drifts in the system. As a result, these architectures may not need a complex controller and physical (PHY) layer design, and hence broaden the I/O link usage for most of the die disaggregation applications.

In some embodiments, pulse width generator 217 can also be added to architecture 500 to allow for an additional knob to adjust the clock edge. The pulse width generator 217 in that case can be controlled by any suitable means. For example, pulse width generator 217 can be controlled by FSM 332 and/or by software (e.g., operating system).

In some embodiments, the loopback clock path and the long clock path along with the phase detector and FSM 332 can also be added to architecture 200 to provide additional knobs for centering the sampling clock edge in the middle of the data eye for the source synchronous architecture. The dynamic and continuous compensation of the process, voltage, random and systematic variations can be applied to both architectures 200 and 500, in accordance with some embodiments.

Figure 7:
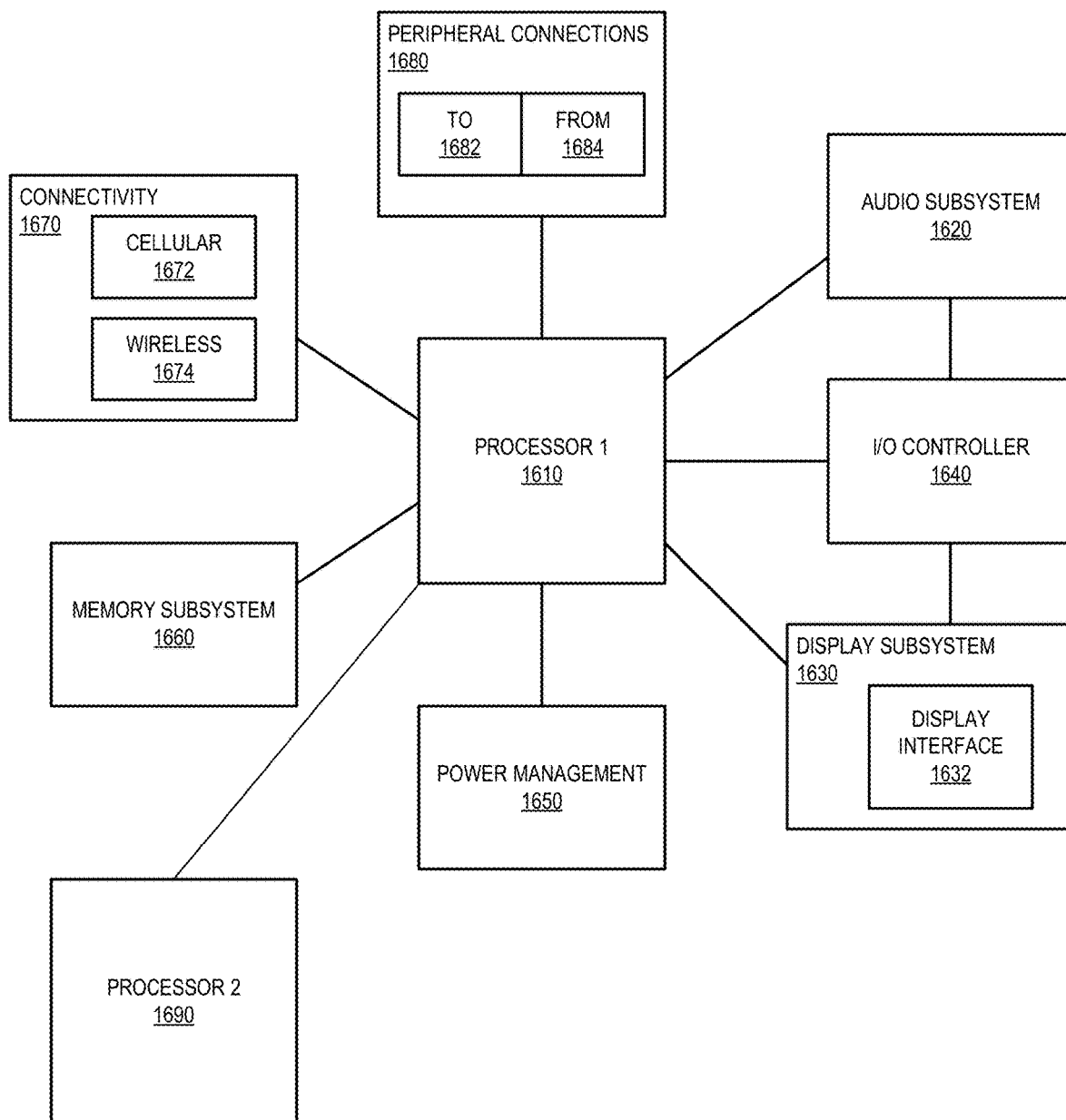
FIG. 7 illustrates a smart device or a computer system or a SoC (System-on-Chip) having one or both of architectures of FIG. 2 and/or FIG. 5, according to some embodiments of the disclosure.

FIG. 7 illustrates a smart device or a computer system or a SoC (System-on-Chip) having one or both of architectures of FIG. 2 and/or FIG. 5, according to some embodiments of the disclosure. FIG. 7 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 (e.g., die 1 102) coupled to second processor 1690 (e.g., die 2 103) having an apparatus of FIG. 2 or FIG. 5 distributed between the two dies according to some embodiments discussed. Other blocks of the computing device 1600 may also include an apparatus of FIG. 2 or FIG. 5 for cancelling PVT and random/systematic variations between and across dies, according to some embodiments. The various embodiments of the present disclosure may also comprise a network interface within 1670 such as a wireless interface so that a system embodiment may be incorporated into a wireless device, for example, cell phone or personal digital assistant. In some embodiments, precessor 1 1610 itself may be comprised of many dies connected through µBumps, and RDLs as shown in FIG. 1.

Referring back to FIG. 7, in some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600 or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
 a clock compensation circuit to adjust one or more signal characteristics of an input clock, and to provide first and second clocks;
 a data transmitter to sample data, for transmission, with a version of the first clock and to transmit the sampled data to a data receiver, wherein the data receiver is to receive the sampled data and to generate a received data; and
 a clock transmitter to transmit the second clock to a clock receiver, wherein the clock receiver is to receive the second clock and generate a third clock, wherein a phase of the third clock is adjusted by a pulse width generator to generate a fourth clock, and wherein a delayed version of the fourth clock is received by a sampler coupled to the data receiver to sample the received data.

2. The apparatus of claim 1, wherein the pulse width generator is to adjust a falling edge of the third clock to generate the fourth clock.

3. The apparatus of claim 1, wherein the clock compensation circuit has programmable delay such that the first and second clocks can be delayed independently.

4. The apparatus of claim 1 comprises a phase locked loop to generate the input clock.

5. The apparatus of claim 1 comprises a clock distribution network to receive the first clock and to generate the version of the first clock as an output of the clock distribution network.

6. The apparatus of claim 1, wherein the data receiver and the clock receiver are in a different die than a die comprising the data transmitter and the clock transmitter.

7. The apparatus of claim 6, wherein the die is a first die, wherein the different die is a second die, and wherein the second die comprises a clock distribution circuit to receive the fourth clock and to generate the delayed version of the fourth clock.

8. The apparatus of claim 7, wherein the first and second dies are coupled to one another via a silicon interposer or a through silicon via (TSV).

9. The apparatus of claim 7, wherein the first and second dies are positioned in a package along a same plane.

10. The apparatus of claim 7, wherein the first and second dies are positioned in a package in different planes.

11. The apparatus of claim 1, wherein the pulse width generator is to adjust an edge of the fourth clock at a training mode.

12. A system comprising:
a memory;
a first die coupled to the memory;
a second die coupled to the first die, wherein the first die includes:
 a clock compensation circuit to adjust one or more signal characteristics of an input clock, and to provide first and second clocks;
 a data transmitter to sample data, for transmission, with a version of the first clock and to transmit the sampled data to a data receiver in the second die, wherein the data receiver is to receive the sampled data and generate a received data; and
 a clock transmitter to transmit the second clock to a clock receiver in the second die, wherein the clock receiver is to receive the second clock and generate a third clock, wherein a phase of the third clock is adjusted by a pulse width generator to generate a fourth clock, and wherein a delayed version of the fourth clock is received by a sampler coupled to the data receiver to sample the received data; and
a communication interface to allow the first or second dies to communicate with another device.

13. The system of claim 12, wherein the first and second dies are coupled to one another via a silicon interposer or a through silicon via.

14. The system of claim 12, wherein the first and second dies are positioned in a package along a same plane, or wherein the first and second dies are positioned in a package in different planes.

* * * * *